(12) United States Patent
Ryuzaki et al.

(10) Patent No.: US 8,106,385 B2
(45) Date of Patent: Jan. 31, 2012

(54) ORGANIC SILOXANE FILM, SEMICONDUCTOR DEVICE USING THE SAME, FLAT PANEL DISPLAY DEVICE, AND RAW MATERIAL LIQUID

(75) Inventors: Daisuke Ryuzaki, Kodaira (JP); Hiroshi Fukuda, London (GB)

(73) Assignee: Hitachi Chemical Co., Ltd., Tokyo (JP)

( * ) Notice: Subject to any disclaimer, the term of this patent is extended or adjusted under 35 U.S.C. 154(b) by 839 days.

(21) Appl. No.: 11/571,017

(22) PCT Filed: Jun. 17, 2005

(86) PCT No.: PCT/JP2005/011129
§ 371 (c)(1),
(2), (4) Date: Aug. 14, 2008

(87) PCT Pub. No.: WO2005/124846
PCT Pub. Date: Dec. 29, 2005

(65) Prior Publication Data
US 2008/0308790 A1 Dec. 18, 2008

(30) Foreign Application Priority Data
Jun. 21, 2004 (JP) ................. 2004-182357

(51) Int. Cl.
*H01L 29/08* (2006.01)
*H01L 35/24* (2006.01)
*H01L 51/00* (2006.01)
*H01L 23/58* (2006.01)

(52) U.S. Cl. .............. 257/40; 257/642; 257/E27.117; 257/E27.118; 257/E27.119; 257/E39.007; 257/E51.001; 257/E51.038; 257/E51.046

(58) Field of Classification Search ............... 257/40, 257/642, E27.117, E27.118, E27.119, E39.007, 257/E51.001, E51.038, E51.046
See application file for complete search history.

(56) References Cited

U.S. PATENT DOCUMENTS

| | | | |
|---|---|---|---|
| 5,693,566 A * | 12/1997 | Cheung ................... | 438/624 |
| 6,177,143 B1 * | 1/2001 | Treadwell et al. ........ | 427/515 |
| 6,177,199 B1 | 1/2001 | Hacker et al. | |
| 6,680,541 B2 * | 1/2004 | Furusawa et al. ........ | 257/759 |
| 6,777,325 B2 * | 8/2004 | Ryuzaki et al. .......... | 438/637 |
| 6,919,278 B2 * | 7/2005 | Kang et al. ............... | 438/706 |
| 7,084,070 B1 * | 8/2006 | Lee et al. ................. | 438/714 |

(Continued)

FOREIGN PATENT DOCUMENTS
JP  2001-122611 A  5/2001

(Continued)

OTHER PUBLICATIONS

Potential Solutions, Dielectric Potential Solutions, Interconnect, International Technology Roadmap for Semiconductors, 2003 edition, pp. 9-12.

(Continued)

*Primary Examiner* — Ida M Soward
(74) *Attorney, Agent, or Firm* — Westerman, Hattori, Daniels & Adrian, LLP

(57) ABSTRACT

Disclosed is materials design for prolonging the duration of the low relative dielectric constant of an organic siloxane film having a low relative dielectric constant. Specifically, in an organic siloxane film having a relative dielectric constant of not more than 2.1, the elemental ratio of carbon to silicon in the film is set to not less than 0.10 and not more than 0.55.

20 Claims, 11 Drawing Sheets

U.S. PATENT DOCUMENTS

| | | | |
|---|---|---|---|
| 7,166,535 B2 * | 1/2007 | Li et al. | 438/706 |
| 7,273,060 B2 * | 9/2007 | Patel et al. | 134/1.3 |
| 7,547,635 B2 * | 6/2009 | Eppler et al. | 438/710 |
| 2002/0142610 A1 * | 10/2002 | Chien et al. | 438/710 |
| 2002/0182880 A1 * | 12/2002 | Zhu et al. | 438/724 |
| 2003/0032284 A1 * | 2/2003 | Enomoto et al. | 438/687 |
| 2003/0087534 A1 * | 5/2003 | Mallikarjunan et al. | 438/781 |
| 2003/0201465 A1 | 10/2003 | Ryuzaki et al. | |

FOREIGN PATENT DOCUMENTS

| | | |
|---|---|---|
| JP | 2002-534804 A | 10/2002 |
| JP | 2003-174023 A | 6/2003 |
| JP | 2003-179232 A | 6/2003 |
| JP | 2003-243384 A | 8/2003 |
| JP | 2003-309173 A | 10/2003 |
| JP | 2004-6822 A | 1/2004 |
| WO | WO 2004/023539 A1 | 3/2004 |

OTHER PUBLICATIONS

N. Ohashi et al.; "Robust Porous MSQ (k=2.3, E=12 GPa) for Low-temperature (<350°C.) Cu/Low-k Integration using ArF Resist Mask Process"; IEEE 2003, p. 35.5.1-35-5.4.

Daisuke Ryuzaki et al.; "Time Dependent Dielectric-Constant Increase Reliability Issue for Low Dielectric-Constant Materials", Journal of the Electrochemical Society, vol. 150, No. 12, pp. F203-FR205, 2003.

International Search Report of PCT/JP2005/011129, date of mailing: Sep. 27, 2005.

* cited by examiner

ORGANIC SILOXANE FILM, SEMICONDUCTOR DEVICE USING THE SAME, FLAT PANEL DISPLAY DEVICE, AND RAW MATERIAL LIQUID

TECHNICAL FIELD

The present invention relates to a siloxane-based insulating material with a low dielectric constant and a semiconductor device with high performance and high reliability using the insulating material as an inter-layer insulating film.

BACKGROUND OF ART

In Recent years, with the view point of increasing the integration degree and the operation speed of semiconductor devices typically represented by a large scale integrated circuits (LSI), reduction of the inter-layer capacitance has been required. Then, studies have been conducted vigorously for introducing low dielectric constant films with lower relative dielectric constant than that of existent silicon oxide films (relative dielectric constant of from 3.9 to 4.2) as the inter-layer insulating films.

Typical examples of the low dielectric constant film with the relative dielectric constant of 3 or less include organic siloxane films, inorganic siloxane films, and organic aromatic polymer films. The organic siloxane film mainly comprises silicon, oxygen, carbon and hydrogen and has a siloxane skeleton and methyl group (—$CH_3$). Typical examples are methylated siloxane (MSQ) and methylated hydrosiloxane (HMSQ) films. The inorganic siloxane film mainly contains silicon, oxygen, and hydrogen and has a siloxane skeleton and a hydrogen group (—H). A hydrosiloxane (HSQ) film is a typical example. The aromatic organic polymer film mainly comprises carbon and hydrogen (in some cases, also contains a micro-amount of silicon and oxygen), and has a benzene ring skeleton. Typical examples are SiLK (name of products) manufactured by Dow Chemical Co. and CYCLOTENE (name of products) also manufactured by Dow Chemical Co., FLARE (name of products) manufactured by Honeywell Co., and CRA (name of products) manufactured by Sumitomo Bakelite Co.

Further, while the relative dielectric constant of the low dielectric constant films described above is from 2.6 to 3.0, porous low dielectric constant films (relative dielectric constant of 2.5 or less) with the relative dielectric constant being further lowered by introducing voids in the low dielectric constant films have been studied extensively. According to Non-Patent Document 1, a low dielectric constant film with the relative dielectric constant of 2.4 or lower is necessary for LSI in the 65 nm generation. Further, a low electric constant film with the relative dielectric constant of 2.1 or lower is necessary for LSI in the 45 nm generation.

A most prospective candidate for the porous low dielectric constant films described above is a porous organic siloxane film. The porous organic siloxane film can have various combinations of composition and dielectric constant. As the index for expressing the composition, use of a carbon content/silicon content (elemental ratio of the carbon content to silicon content) is convenient.

Patent Document 1 discloses a method of manufacturing a coating type organic siloxane film. As the raw material for forming the siloxane skeleton, tetraethoxy silane of 1.2 g and methyltrimethoxy silane of 6.3 g are used. Further, as a thermally decomposing material for forming voids in the film, polyethylene glycol monomethacrylate of 5.2 g is used. The raw materials and a solvent are mixed to prepare an organic siloxane coating solution and a coating type organic siloxane film is obtained by rotary coating and thermosetting. The carbon content/silicon content (can be calculated based on the molar ratio of tetraethoxy silane and methyltrimethoxy silane) of the organic siloxane film after thermosetting is 0.89 and the relative dielectric constant is 2.0. Further, Non-Patent Document 2 discloses the carbon content/silicon content and the relative dielectric constant of the coating type organic siloxane film. It is described that the carbon content/silicon content is 0.60 (result of analysis by X-ray photoelectron spectroscopy) and the relative dielectric constant thereof is 1.97 for the organic siloxane film shown as an example.

Further, Patent Document 2 discloses a method of manufacturing a plasma type organic siloxane film. After introducing diethoxymethyl silane as the raw material for forming the siloxane sleketon and α-terpen oil as a void-forming thermally decomposing material in the film into a vacuum chamber and reacting them through polymerization by a plasma chemical vapor deposition method, α-terpen oil is removed by annealing. The carbon content/silicon content is 0.69 to 0.75 and the relative dielectric constant is 2.10 to 2.80 for the plasma type organic siloxane film obtained as described above (result of analysis by X-ray photoelectron spectroscopy).

In addition to the literatures shown above, various techniques concerning the porous organic siloxane film having relative dielectric constant of 2.5 or less have been reported. Further, various preparation examples of semiconductor devices using the porous organic siloxane film as the inter-layer insulating film have also been reported (for example, in Patent Document 3).

On the other hand, there has been reported a concern about the reliability of the porous organic siloxane film and the semiconductor device using the same as an inter-layer insulating film. According to Non-Patent Document 3, it has been pointed out that the relative dielectric specific constant increases due to electric field stress in the case where the low dielectric constant film is used continuously for a long time as the inter-layer insulating film. That is, it suggests that the relative dielectric constant of the low dielectric constant film has a limited life. In the examples shown in the literatures, some porous organic siloxane films (relative dielectric constant of 2.3) have a relative dielectric constant life of about 100 years under actual conditions of use. Further, it is described that some porous organic siloxane films (relative dielectric constant of 2.4) have a relative dielectric constant life of only about 30 days under the actual use conditions. In the case of using a porous organic siloxane film having the relative dielectric constant life of only about 30 days as the inter-layer insulating film, it is anticipated also the life for the inter-wiring capacitance of the semiconductor device is about only 30 days. However, a performance for 10 years or more has to be generally ensured for semiconductor devices, and the porous organic siloxane film with such a short relative dielectric constant life is not suitable to the inter-layer insulating film.

Patent Document 1: JP-A No. 2001-122611
Patent Document 2: JP-A No. 2004-6822
Patent Document 3: JP-A No. 2003-243384
Non-Patent Document 1: International Technology Roadmap for Semiconductors 2003 Edition, International Roadmap Committee, 2003
Non-Patent Document 2: Technical Digest of IEEE International Devices Meeting, 2003, p. 35.5.1-35.5.4

Non-Patent Document 3: Journal of The Electrochemical Society, vol. 150, No. 12, 2003, p. F203-F205.

DISCLOSURE OF THE INVENTION

Subject to be Solved by the Invention

In view of the subject for the organic siloxane film described above, the present invention intends to provide a guidance of material design for prolonging the life of the relative dielectric constant of an organic siloxane with a low relative dielectric constant. Further, it also intends to provide a semiconductor device of high performance and high reliability and a flat panel display device using the organic siloxane film as an inter-layer insulating film.

Means for Solving the Subject

The foregoing object can be attained by defining the content of carbon atoms relative to the ratio of the content of silicon atoms (hereinafter referred to as carbon content/silicon content) to 0.10 or more and 0.55 or less in an organic siloxane film with a relative dielectric constant of 2.1 or less. The reason is to be described based on experimental facts.

A plurality of organic siloxane films with a carbon content/silicon content of 0.45 to 0.65 and a relative dielectric constant of 2.1 were prepared and the relative dielectric constant life was measured. In this case, the carbon content/silicon content, the relative dielectric constant, and the relative dielectric constant life were measured in accordance with the following measuring methods.

[Method of Measuring Carbon Content/Silicon Content]

In order to quantitatively measure the carbon content/silicon content from the organic siloxane film, analysis with Auger electron spectroscopy is preferably used. Fourier transformation type infrared spectroscopy (FT-IR) is not appropriate because it lacks in the quantitative performance. The carbon content/silicon content in the organic siloxane film in the invention is a ratio between the carbon element concentration and the silicone element concentration when measured with a beam diameter of 1 µm in an AES analyzer. Specifically, a specimen in which only an organic siloxane film with a thickness of 200 nm±20 nm was formed on a substrate is shaped into about 1 cm square and introduced into an AES analyzer (PH 1670: Physical Electronics Co.). Then, the organic siloxane film was etched by about 50 nm from the surface to expose a clean surface in an AES analyzer under an argon sputtering condition at an argon partial pressure of 10 mPa and an ion acceleration voltage of 1.5 kV. Then, the concentration of the carbon element and the concentration of the silicon element were measured by an electron beam at an acceleration voltage of 10 kV, a beam current of 10 nA and a beam diameter of 1 µm to calculate the carbon content/silicon content. In the measuring conditions described above, the carbon content/silicon content of the silicon thermal oxide film of 200 nm±20 nm thickness was 0.00 and the carbon content/silicon content in the single crystal carbide silicon film of 200 nm±20 nm thickness was 1.00. It is preferred to confirm that the AES analyzer has been calibrated sufficiently by using the silicon thermal oxide film or a single crystal silicon carbide film whose elemental composition has already been known in advance. Further, in the case of measuring the carbon content/silicon content in the organic siloxane film incorporated in a device such as a semiconductor device or a flat panel display device, since the organic silicon film is not exposed to the uppermost surface of the device, analysis cannot be conducted. In such a case, after shaping the device to about 1 cm square, the organic silicon film may be polished such that it is exposed to the uppermost surface. After introducing the specimen into the AES analyzer, the cleaned surface may be exposed under the argon sputtering conditions same as those described above and the carbon element concentration and the silicon element concentration may be measured by electron beams under the same conditions as those described above.

[Method of Measuring Relative Dielectric Constant]

The relative dielectric constant of the organic siloxane film in the invention means herein a value measured in an atmosphere at a temperature of 140° C.±5° C. and at a humidity of 10% or lower, which is determined by the measurement for the charge capacitance between an aluminum electrode and an n-type silicon substrate. Specifically, an organic siloxane film for measurement of the relative dielectric constant is first formed. For example, the organic siloxane film is formed to a thickness of 200 nm±20 nm on an n-type silicon substrate (resistivity<10 Ωcm). Then, a circular aluminum electrode of 2 mm diameter is vacuum vapor depositing to a thickness of about 100 nm on the organic siloxane film by a vacuum vapor deposition apparatus. Thus, a so-called MIS structure sample in which the organic siloxane film is interposed between the aluminum electrode and the n-type silicon substrate is formed. Then, the charge capacitance of the MIM structure sample is measured by using an apparatus in which an LF impedance analyzer (HP4192A, manufactured by Ajirent Ltd.) is connected with a dielectric test fixture (HP16451B, manufactured by Ajirent Ltd.), at a substrate temperature of 140° C., in a nitrogen purge atmosphere at a frequency of 10 kHz. Then, the measured value of the charge capacitance is substituted in the following equation (1):

$$\text{Specific dielectric constant of organic siloxane film} = 3.597 \times 10^{-5} \times \text{charge capacitance (pF)} \times \text{film thickness of organic siloxane film (nm)} \quad (1)$$

and the relative dielectric constant of the silica type deposition film is calculated.

[Method of Measuring Relative Dielectric Constant Life]

The MIS structure sample shown in [method of measuring relative dielectric constant] is used. An electric field with an electric field strength of from 0.5 to 8.0 MV/cm was applied between an aluminum electrode and an n-type silicon substrate of the MIS structure sample by using a pA meter/DC voltage source meter (HP4140B, manufactured by Ajirent Ltd.). When the relative dielectric constant is measured continuously while applying the electric field continuously as described above, the relative dielectric constant increases for a certain time and then settles constant. The time in which the relative dielectric constant increases is measured for each of the electric field strength, to prepare a graph with the common logarithm for the time being on the ordinate and the electric field strength being on the abscissa. The extrapolation value to the electric field strength of 0.2 MV/cm in the graph is defined as the relative dielectric constant life.

A relation between the carbon content/silicon content of the organic siloxane film measured by the measuring method described above and the relative dielectric constant life is, for example, as shown in FIG. 1. That is, as the carbon content/silicon content is smaller, the relative dielectric constant life is longer, and the relative dielectric constant life is prolonged when the carbon content/silicon content is 0.55 or less (for example, 10 years or more in FIG. 1). The carbon content/silicon content has a lower limit and a problem of hygroscopicity occurs in the case where the carbon content/silicon content decreases to 0.10 or less. For the reasons described above, the carbon content/silicon content is, preferably, 0.10 or more and 0.55 or less, more preferably, 0.25 or more and 0.55 or less and, further more preferably, 0.40 or more and 0.55 or less. The upper limit may be 0.5 or less or 0.45 or less.

FIG. 2 shows the increasing rate of the relative dielectric constant (increasing rate of the relative dielectric constant in the relative dielectric constant life) of the organic siloxane film with the carbon content/silicon content of 0.55 and the relative dielectric constant of from 1.8 to 2.3, at the dielectric strength used actually. That is, it can be seen that in the case where the relative dielectric constant is 2.1 or less, increasing rate of the relative dielectric constant exceeds 10%, and the increasing degree of the relative dielectric constant becomes larger. The increasing rate of the relative dielectric constant exceeding 10% means that the relative dielectric constant increases as high as 2.3, for example, in the case of an organic siloxane film with a relative dielectric constant of 2.1 which is required for LSI in the 45 nm generation. That is, since this is identical with the relative dielectric constant required for LSI in the 65 nm generation, this is equivalent with a case where the generation retrograded. On the other hand, in the case where the relative dielectric constant is 2.1 or more, since the increasing rate of the relative dielectric constant is less than 10%, increase of the relative dielectric constant is so small as causing no problem. A new subject of the increasing rate of the relative dielectric constant which results in a problem in the case where the relative dielectric constant is 2.1 or less has been arisen and the invention intends to solve the same.

The cause that the carbon content/silicon content is concerned with the relative dielectric constant life is to be described with reference to FIG. 3. FIG. 3 compares spectra of Fourier conversion type IR spectroscopy between the initial film of the organic siloxane film and that after increase of the relative dielectric constant (just after relative dielectric constant life). According to the graph, the methyl group as the organic group in the organic siloxane film is completely destroyed substantially just after the relative dielectric constant life. This is destruction by the electric field stress, that is, it is considered that the probability of destruction of the methyl groups caused by the electric field stress increases more as the carbon content/silicon content is larger, which results in reduced relative dielectric constant life.

Further, the cause that the increasing rate of the relative dielectric constant is larger as the relative dielectric constant is smaller. Since voids in the organic silicon film tend to increase as the relative dielectric constant is smaller, it is considered that the hygroscopic amount increases in the case where the methyl group is destroyed at the relative dielectric constant life.

The relative dielectric constant of the organic siloxane film in the invention is preferably 2.1 or less. To suppress the process durability due to the lowering of the mechanical strength of the material, the relative dielectric constant is preferably 1.5 or more and 2.1 or less. Further, to provide the sufficient process durability, the relative dielectric constant is preferably 1.8 or more and less than 2.1. The upper limit can be 2.0 or less or 1.9 or less.

The organic siloxane film obtained by the invention can be formed, for example, by using a process of coating a raw material liquid containing polysiloxane on a substrate. In this case, a sensitizer may be added to the raw material liquid and the organic siloxane film may be patterned by using a lithographic process together.

As the raw material liquid described above, those described, for example, in JP-A No. 2004-277501, WO05/036269, JP-A Nos. 2000-21245 and Hei 9-213797 can be used.

Further, the organic siloxane film can also be formed, for example, by using a process of depositing a film on a substrate by plasma chemical vapor deposition or thermochemical vapor deposition.

Effect of the Invention

As has been described above, according to the present invention, the relative dielectric constant life of the organic siloxane film can be made longer. Thus, a porous organic siloxane film of low relative dielectric constant and with long time reliability can be attained and, further, a semiconductor device and a flat panel display device of high performance and high reliability can be attained by using the porous organic siloxane film, for example, as an inter-layer insulating film.

BEST MODE FOR CARRYING OUT THE INVENTION

While the present invention is to be described specifically using examples, the invention is not limited to such examples and applicable to various fields.

Example 1

A solution in which tetraethoxy silane of 100.0 g and methyltriethoxy silane of 70.0 g were dissolved in propylene glycol monopropyl ether of 392.4 g was prepared. In the solution, water of 50.3 g in which 70% nitric acid of 0.47 g was dissolved was dropped in the solution under stirring for 30 minutes. After the completion of dropping, they were reacted for 5 hours to obtain a polysiloxane solution. Then, a γ-butyrolactone solution of 110.6 g in which 20% polymethyl methacrylate was dissolved was added in the polysiloxane solution. Finally, formed ethanol was distilled off under a reduced pressure in a warm bath to obtain an organic siloxane-coating solution of 680 g containing polysiloxane and polymethacrylate.

The obtained organic siloxane coating solution was rotationally coated to an n-type silicon substrate at a number of rotation of 1500 rpm for a rotational time of 30 seconds. Successively, baking at 150° C. for 30 seconds and baking at 250° C. for one minute were applied in this order on a hot plate under a nitrogen atmosphere to evaporate the solvent in the coating film. Further, baking at 400° C. for 30 minutes was applied in a nitrogen atmosphere by using a vertical quartz furnace to finally cure the coating film and, at the same time, thermally decomposed polymethacrylate in the film.

When the carbon content/silicon content in the thus obtained coating type organic siloxane film was measured in accordance with the foregoing [method of measuring carbon content/silicon content], the measured value was 0.45, which substantially agreed with the theoretical calculated value of 0.45 for the carbon content/silicon content of the polysiloxane contained in the organic siloxane coating solution. Further, when the relative dielectric constant of the coating type organic siloxane film was measured in accordance with [method of measuring relative dielectric constant] described above, the measured value was 2.0. Further, when the relative dielectric constant life of the coating type organic siloxane film was measured in accordance with [method of measuring relative dielectric constant life] described above, the relative dielectric constant life at an electric strength of 0.2 MV/cm used actually was $4.0 \times 10^{10}$ seconds (10 years or more). That is, even when the coating type organic siloxane film manufactured in the example was used as the inter-layer insulating film for a semiconductor device for 10 years, it was guaranteed that the relative dielectric constant less changed during the period.

Example 2

A solution in which tetraethoxy silane of 100.0 g and methyltriethoxy silane of 85.6 g were dissolved in propylene glycol monopropyl ether of 433.9 g was prepared. In the solution, water of 54.5 g in which 70% nitric acid of 0.50 g was dissolved was dropped in the solution under stirring for 30 minutes. After the completion of dropping, they were reacted for 5 hours to obtain a polysiloxane solution. Then, a γ-butyrolactone solution of 152.9 g in which 20% polymethyl methacrylate was dissolved was added in the polysiloxane solution. Finally, formed ethanol was distilled off under a reduced pressure in a warm bath to obtain an organic siloxane-coating solution of 750 g containing polysiloxane and polymethacrylate.

The obtained organic siloxane coating solution was rotationally coated to an n-type silicon substrate at a number of rotation of 1500 rpm for 30 seconds of a rotational time. Successively, baking at 150° C. for 30 seconds and baking at 250° C. for one minute were applied in this order on a hot plate under a nitrogen atmosphere to evaporate the solvent in the coating film. Further, baking at 400° C. for 30 minutes was applied in a nitrogen atmosphere by using a vertical quartz furnace to finally cure the coating film and, at the same time, thermally decomposed polymethacrylate in the film.

When the carbon content/silicon content in the thus obtained coating type organic siloxane film was measured in accordance with the foregoing [method of measuring carbon content/silicon content], the measured value was 0.50, which substantially agreed with the theoretical calculated value of 0.50 for the carbon content/silicon content of the polysiloxane contained in the organic siloxane coating solution. Further, when the relative dielectric constant of the coating type organic siloxane film was measured in accordance with [method of measuring relative dielectric constant] described above, the measured value was 2.0. Further, when the relative dielectric constant life of the coating type organic siloxane film was measured in accordance with [method of measuring relative dielectric constant life] described above, the relative dielectric constant life at an electric strength of 0.2 MV/cm used actually was $3.0 \times 10^9$ sec (10 years or more). That is, even when the coating type organic siloxane film manufactured in the example was used as the inter-layer insulating film for a semiconductor device for 10 years, it was guaranteed that the relative dielectric constant less changed during the period.

Example 3

A solution in which tetraethoxy silane of 100.0 g and methyltriethoxy silane of 104.6 g were dissolved in propylene glycol monopropyl ether of 484.1 g was prepared. In the solution, water of 59.6 g in which 70% nitric acid of 0.55 g was dissolved in the solution was dropped under stirring for 30 minutes. After the completion of dropping, they were reacted for 5 hours to obtain a polysiloxane solution. Then, a γ-butyrolactone solution of 170.6 g in which 20% polymethyl methacrylate was dissolved was added in the polysiloxane solution. Finally, formed ethanol was distilled off under a reduced pressure in a warm bath to obtain an organic siloxane-coating solution of 840 g containing polysiloxane and polymethacrylate.

The obtained organic siloxane coating solution was rotationally coated to an n-type silicon substrate at a number of rotation of 1500 rpm for 30 seconds of a rotational time. Successively, baking at 150° C. for 30 seconds and baking at 250° C. for one minute were applied in this order on a hot plate under a nitrogen atmosphere to evaporate the solvent in the coating film. Further, baking at 400° C. for 30 minutes was applied in a nitrogen atmosphere by using a vertical quartz furnace to finally cure the coating film and, at the same time, thermally decomposed polymethacrylate in the film.

When the carbon content/silicon content in the thus obtained coating type organic siloxane film was measured in accordance with the foregoing [method of measuring carbon content/silicon content], the measured value was 0.55, which substantially agreed with the theoretical calculated value of 0.55 for the carbon content/silicon content of the polysiloxane contained in the organic siloxane coating solution. Further, when the relative dielectric constant of the coating type organic siloxane film was measured in accordance with [method of measuring relative dielectric constant] described above, the measured value was 2.0. Further, when the relative dielectric constant life of the coating type organic siloxane film was measured in accordance with [method of measuring relative dielectric constant life] described above, the relative dielectric constant life at an electric strength of 0.2 MV/cm used actually was $3.5 \times 10^8$ sec (10 years or more). That is, even when the coating type organic siloxane film manufactured in the example was used as the inter-layer insulating film for a semiconductor device for 10 years, it was guaranteed that the relative dielectric constant less changed during the period.

Example 4

Methyltriethoxy silane, ethyl benzene, nitrogen monoxide, and helium were introduced respectively at a flow rate of 180 sccm, 100 sccm, 40 sccm, and 600 sccm to a vacuum chamber of a plasma chemical vapor deposition apparatus. The pressure in the vacuum chamber was 12 Torr. Successively, RF plasmas at a power of 300 W were applied for 140 sec to deposit a polysiloxane film containing ethyl benzene on an n-type silicon substrate disposed in the vacuum chamber. In this case, the substrate temperature was 130° C. Then, the polysiloxane film was baked in a vertical quartz furnace in a nitrogen atmosphere at 400° C. for 30 minutes to remove ethyl benzene in the film.

When the carbon content/silicon content in the thus obtained plasma type organic siloxane film was measured in accordance with [method of measuring carbon content/silicon content] described above, the measured value was 0.47. Further, when the relative dielectric constant of the coating type organic siloxane film was measured in accordance with [method of relative dielectric constant] described above, the measured value was 2.1. Further, when the relative dielectric constant life of the coating type organic siloxane film was measured in accordance with [method of measuring relative dielectric constant life], the relative dielectric constant life at an electric strength of 0.2 MV/cm used actually was $3.6 \times 10^{10}$ seconds (10 years or more). That is, even when the coating type organic siloxane film manufactured in the example was used as the inter-layer insulating film for a semiconductor device for 10 years, it was guaranteed that the relative dielectric constant less changed during the period.

Example 5

Multi-layered copper wirings for a semiconductor device were manufactured by using the organic siloxane films shown in Examples 1 to 4 as the inter-layer insulating film. The manufacturing method for them is to be described with reference to FIGS. 4 to 13. As shown in FIG. 4, a transistor comprising an impurity diffusion layer 3 and a gate electrode 4 surrounded with a device isolation structure 2 is present on the surface of a silicon substrate 1. Further, a first inter-layer insulating film 5 is formed so as to cover the transistor, and contact plug 6 is connected with the impurity diffusion layer 3 for electrical conduction with the upper layer. After forming the contact plug 6, a second inter-layer insulating film 7 with a thickness of 30 nm was deposited as an etching stopper film. An organic siloxane film 8 as described in any one of Examples 1 to 4 was deposited to 150 nm thereon. Further, a protection insulating film 9 was deposited to 50 nm as a protection film for the organic siloxane film 8. First layer wirings were formed by a single damascene method shown below.

At first, as shown in FIG. 5, a resist pattern was formed on the protection insulating film 9 and, after forming a first layer wiring trench 10 by dry etching, the resist pattern was removed. Successively, as shown in FIG. 6, a laminate film of tantalum nitride and tantalum was deposited to 15 nm in total as a barrier metal 11 by using a sputtering method, and copper film 12 of 400 nm in total was buried in the first layer wiring trench 10 by using a sputtering method and an electrolytic plating method. Further, as shown in FIG. 7, a surplus metal film outside of the wiring trench was removed in the order of the copper film 12 and the barrier metal 11 by a chemical-mechanical polishing method and the protection insulating film 9 is exposed to complete first layer wirings.

Then, second layer wirings were formed by a dual damascene method capable of forming an inter-layer connection and a wiring layer simultaneously as described below.

At first, as shown in FIG. 8, a barrier insulating film 13 of 30 nm thickness and an organic siloxane film 8 of 300 nm were deposited in this order above the exposed copper film 12 and the protection insulating film 9 and, further, a protection insulating film 9 was formed further thereover. Successively, as shown in FIG. 9, an inter-layer connection hole 14 and a second layer wiring trench 15 were formed by repeating formation of the resist pattern, dry etching and removal of resist. Further, as shown in FIG. 10, the barrier metal 11 and the copper film 12 were buried simultaneously in the inter-layer connection hole 14 and the second layer wiring trench 15 by the same method as in FIG. 6.

Finally, as shown in FIG. 11, a surplus metal film outside the second layer wiring trench 15 was removed by a chemical mechanical polishing method to complete second layer wirings.

Then, as shown in FIG. 12, third layer wirings were formed by repeating the same processes as in the second layer wirings. Also the formation of the wiring layer after fourth layer wirings can be attained by repeating the processes described above while optionally changing the thickness of the wiring layer. After forming the uppermost layer wirings, the uppermost layer wirings were covered with a plasma silicon nitride film as a humidity proof film and, further, a polyimide film was formed as a stress relaxation film (not illustrated).

While FIGS. 4 to 12 show cross sectional views of wiring forming process, for easier understanding of a sterical structure, FIG. 13 shows an upper plan view of FIG. 12. FIG. 12 shows a cross section along A-A in FIG. 13. The third layer wirings comprising a barrier metal 11 and a copper film 12 are arranged in parallel while being surrounded with the protection insulating film 9. Reference numeral 16 denotes a cutting line corresponding to the cross sectional view of FIG. 12. The first layer wirings are arranged in parallel with the third layer wirings and the second layer wirings are arranged in perpendicular to the third layer wirings and, accordingly, wirings in the layers adjacent vertically cross to each other.

In the multi-layered copper wirings obtained in the wiring forming process described above, the carbon content/silicon content in the organic siloxane film of Examples 1 to 4 present between the wirings was measured in accordance with [method of measuring carbon content/silicon content] described above. As a result, in any of the cases of using the organic siloxane films of Examples 1 to 4, the carbon content/silicon content was substantially identical with numerical values described in each of the examples. That is, the carbon content/silicon content in the organic siloxane film scarcely changed before and after the wiring forming process. Further, when the inter-wiring electric capacitance was measured, it was 0.45 pF/cm in the case of using organic siloxane films of Examples 1 to 3, and 0.48 pF/cm in the case of using the organic siloxane film of Example 4. Further, when the interconnection electrical capacitance life was measured, the inter-layer electrical capacitance life at an electric field strength of 0.2 MV/cm used actually was substantially equal with the relative dielectric constant life of the organic siloxane film described in each of the examples and each of them was 10 years or more. That is, in a case of manufacturing the multi-layered copper wirings using the organic siloxane film shown in Examples 1 to 4 as the inter-layer insulating films, it was guaranteed that the inter-wiring capacitance less changed even when they were used for 10 years.

Example 6

Multi-layered aluminum alloy wirings in a semiconductor device were manufactured by using the organic siloxane films shown in Examples 1 to 4 as the inter-layer insulating film. The manufacturing method for them is to be described below with reference to FIGS. 14 to 23.

As shown in FIG. 14, a device isolation structure 2, an impurity diffusion layer 3, a gate electrode 4, a first inter-layer insulating film 5, and a contact plug 6 were formed above a silicon substrate 1. A 30 nm barrier metal 11, a 250 nm aluminum alloy 17, and a 30 nm barrier metal 11 were formed thereon by a sputtering method. As the barrier metal 11, a titanium nitride film was used. After fabricating the metal film by using a resist pattern and dry etching, the resist was removed to form first layer wirings. Successively, a third inter-layer insulating film 18 was deposited to 50 nm and an organic siloxane film 8 was deposited to 400 nm so as to cover the first layer wirings. Further, a protection insulating film 9 was deposited to 600 nm on the organic siloxane film 8. Then, the protection insulating film 9 corresponding to 300 nm was scraped off to be planarized by a chemical-mechanical polishing method.

Then, as shown in FIG. 15, after fabrication by using a resist pattern and dry etching, the resist was removed to form an inter-layer connection hole 14. Successively, as shown in FIG. 16, a barrier metal 11 comprising a titanium nitride film was deposited to 30 nm and a tungsten film 19 was deposited to 300 nm by a chemical vapor deposition method respectively to bury the inter-layer connection hole 14. Then, as shown in FIG. 17, a surplus metal film outside of the inter-layer connection hole 14 was removed by a chemical-mechanical polishing method.

Processes after the second layer wirings were the same as the process for forming the first layer wirings. That is, as shown in FIG. 18, a third insulative layer 18, an organic siloxane film 8, and a protection insulating film 9 were formed in this order above the second layer wirings comprising a barrier metal 11 and an aluminum alloy 17. Then, as shown in FIG. 19, an inter-layer connection hole 14 was formed and, after depositing the barrier metal 11 and the tungsten film 19 as shown in FIG. 20, a surplus metal film other than the inter-layer connection hole 14 was removed as shown in FIG. 21.

Then, as shown in FIG. 22, third layer wirings were formed by repeating the same processes as in the second layer wirings. Also the formation of the wiring layer after fourth layer wirings can be attained by repeating the processes described above while optionally changing the thickness of the wiring layer. After forming the uppermost layer wirings, the uppermost layer wirings were covered with a plasma silicon nitride film as a humidity proof film and, further, a polyimide film was formed as a stress relaxation film (not illustrated).

While FIGS. 14 to 22 show cross sectional views for the wiring forming steps, FIG. 23 shows an upper plan view of FIG. 22 for easier understanding of a sterical structure. FIG. 22 shows an A-A cross section in FIG. 23. Third layer wirings having the barrier metal 11 at the uppermost surface are arranged in parallel with each other on the protection insulating film 9. Reference numeral 20 denotes a cutting line corresponding to the cross sectional view of FIG. 22. The first layer wirings are arranged in parallel with the third layer wirings and the second layer wirings are arranged in perpendicular to the third layer wirings and, accordingly, wirings of the layer adjacent vertically cross to each other.

In the multi-layered aluminum alloy wirings obtained in the wiring forming process described above, the carbon content/silicon content in the organic siloxane film of Examples 1 to 4 present between the wirings was measured in accordance with [method of measuring carbon content/silicon content] described above. As a result, in any of the cases of using the organic siloxane films of Examples 1 to 4, the carbon content/silicon content was substantially identical with numerical values described in each of the examples. That is, the carbon content/silicon content in the organic siloxane film scarcely changed before and after the wiring forming process. Further, when the inter-wiring electric capacitance was measured, it was 0.50 pF/cm in the case of using organic siloxane films of Examples 1 to 3, and 0.52 pF/cm in the case of using the organic siloxane film of Example 4. Further, when the inter-wiring electrical capacitance life was measured, the inter-wiring electrical capacitance life at an electric field strength of 0.2 MV/cm used actually was substantially equal with the relative dielectric constant life of the organic siloxane film described in each of the examples and each of them was 10 years or more. That is, in the case of manufacturing the multi-layered aluminum alloy wirings using the organic siloxane film shown in Examples 1 to 4 as the inter-layer insulating film, it was guaranteed that the inter-wiring capacitance less changed even when they were used for 10 years.

While Examples 7 to 10 shown below are not the best mode for practicing the present invention, they are shown as comparative examples with the embodiment shown in Examples 1 to 6.

Example 7

A solution in which tetraethoxy silane of 100.0 g and methyltriethoxy silane of 128.4 g were dissolved in propylene glycol monopropyl ether of 547.6 g was prepared. In the solution, water of 66.1 g in which 70% nitric acid of 0.61 g was dissolved was dropped in the solution under stirring for 30 minutes. After the completion of dropping, they were reacted for 5 hours to obtain a polysiloxane solution. Then, a γ-butyrolactone solution of 193.0 g in which 20% polymethyl methacrylate was dissolved was added in the polysiloxane solution. Finally, formed ethanol was distilled off under a reduced pressure in a warm bath to obtain an organic siloxane-coating solution of 940 g containing polysiloxane and polymethacrylate.

The obtained organic siloxane coating solution was rotationally coated to an n-type silicon substrate at a number of rotation of 1500 rpm for 30 seconds of a rotational time. Successively, baking at 150° C. for 30 seconds and baking at 250° C. for one minutes were applied in this order on a hot plate under a nitrogen atmosphere to evaporate the solvent in the coating film. Further, baking at 400° C. for 30 minutes was applied in a nitrogen atmosphere by using a vertical quartz furnace to finally cure the coating film and, at the same time, thermally decomposed polymethacrylate in the film.

When the carbon content/silicon content in the thus obtained coating type organic siloxane film was measured in accordance with the foregoing [method of measuring carbon content/silicon content], it was 0.60, which substantially agreed with the theoretical calculated value of 0.60 for the carbon content/silicon content of the polysiloxane contained in the organic siloxane coating solution. Further, when the relative dielectric constant of the coating type organic siloxane film was measured in accordance with [method of measuring relative dielectric constant] described above, the measured value was 2.00. Further, when the relative dielectric constant life of the coating type organic siloxane film was measured in accordance with [method of measuring relative dielectric constant life] described above, the relative dielectric constant life at an electric strength of 0.2 MV/cm used actually was $4.5 \times 10^7$ seconds (10 years or less). Further, the increasing rate of the relative dielectric constant at the relative dielectric constant life was 18%. That is, in the case of using the coating type organic siloxane film manufactured in this example as an inter-layer insulating film for a semiconductor device for 10 years, it was shown that the relative dielectric constant increased to 2.36 within 10 years.

Example 8

A solution in which tetraethoxy silane of 100.0 g and methyltriethoxy silane of 159.0 g were dissolved in propylene glycol monopropyl ether of 629.4 g was prepared. In the solution, water of 74.4 g in which 70% nitric acid of 0.69 g was dissolved was dropped in the solution under stirring for 30 minutes. After the completion of dropping, they were reacted for 5 hours to obtain a polysiloxane solution. Then, a γ-butyrolactone solution of 221.8 g in which 20% polymethyl methacrylate was dissolved was added in the polysiloxane solution. Finally, formed ethanol was distilled off under a reduced pressure in a warm bath to obtain an organic siloxane-coating solution of 1080 g containing polysiloxane and polymethacrylate.

The obtained organic siloxane coating solution was rotationally coated to an n-type silicon substrate at a number of rotation of 1500 rpm for 30 seconds of a rotational time. Successively, baking at 150° C. for 30 seconds and baking at 250° C. for one minute were applied in this order on a hot plate under a nitrogen atmosphere to evaporate the solvent in the coating film. Further, baking at 400° C. for 30 minutes was applied in a nitrogen atmosphere by using a vertical quartz furnace to finally cure the coating film and, at the same time, thermally decomposed polymethacrylate in the film.

When the carbon content/silicon content in the thus obtained coating type organic siloxane film was measured in accordance with the foregoing [method of measuring carbon content/silicon content], it was 0.65, which substantially agreed with the theoretical calculated value of 0.65 for the carbon content/silicon content of the polysiloxane contained in the organic siloxane coating solution. Further, when the relative dielectric constant of the coating type organic siloxane film was measured in accordance with [method of measuring relative dielectric constant] described above, it was 2.00. Further, when the relative dielectric constant life of the coating type organic siloxane film was measured in accordance with [method of measuring relative dielectric constant life] described above, the relative dielectric constant life at an electric strength of 0.2 MV/cm used actually was $1.5 \times 10^7$ seconds (10 years or less). Further, the increasing rate of the relative dielectric constant at the relative dielectric constant life was 18%. That is, in the case of using the coating type organic siloxane film manufactured in this example as an inter-layer insulating film for a semiconductor device for 10 years, it was shown that the relative dielectric constant increased to 2.36 within 10 years.

Example 9

Methyltriethoxy silane, ethyl benzene, nitrogen monoxide, and helium were introduced respectively at a flow rate of 200 sccm, 100 sccm, 20 sccm, and 600 sccm to a vacuum chamber of a plasma chemical vapor deposition apparatus. The pressure in the vacuum chamber was 12 Torr. Successively, RF plasmas at a power of 300 W were applied for 140 seconds to deposit a polysiloxane film containing ethyl benzene on an n-type silicon substrate disposed in the vacuum chamber. In this case, the substrate temperature was 130° C. Then, the polysiloxane film was baked in a vertical quartz furnace in a nitrogen atmosphere, at 400° C. for 30 minutes to remove ethyl benzene in the film.

When the carbon content/silicon content in the thus obtained plasma type organic siloxane film was measured in accordance with [measuring method carbon content/silicon content] described above, it was 0.62. Further, when the relative dielectric constant of the coating type organic siloxane film was measured in accordance with [method of measuring relative dielectric constant] described above, it was 2.1. Further, when the relative dielectric constant life of the coating type organic siloxane film was measured in accordance with [method of measuring relative dielectric constant life], the relative dielectric constant life at an electric strength of 0.2 MV/cm used actually was $4.8 \times 10^7$ seconds (10 years or less). Further, the increasing rate of the relative dielectric constant at the relative dielectric constant life was 11%. That is, in the case of using the plasma type organic siloxane film manufactured in this example as the inter-layer insulating film for a semiconductor device for 10 years, it was shown that the relative dielectric constant increased to 2.33 within 10 years.

Example 10

Multi-layered copper wirings in a semiconductor device were manufactured by using the organic siloxane films shown in Comparative Examples 1 to 3 as the inter-layer insulating film. The method of forming the multi-layered wirings was the same as that shown in Example 5.

The carbon content/silicon content in the organic siloxane films of the Comparative Examples 1 to 3 present between the wirings in the thus manufactured multi-layered copper wirings was measured in accordance with {method of measuring carbon content/silicon content]. As a result, in any case of using the organic siloxane film of Comparative Examples 1 to 4, the carbon content/silicon content was almost equal with numerical values described in each of the examples. That is, the carbon content/silicon content of the organic siloxane film was almost unchanged before and after the wiring forming process. Further, when the inter-wiring electric capacitance was measured, it was 0.45 pF/cm in the case of using the organic siloxane film of Comparative Examples 1 and 2 and 0.48 pF/cm in the case of using the organic siloxane film of Comparative Example 3. Further, when the inter-wiring electric capacitance life was measured, the inter-wiring electrical capacitance life at an electrical field strength of 0.2 MV/cm used actually was almost equal with the relative dielectric constant life of the organic siloxane film described in each of the examples and each of them was 10 years or less. Further, the increasing rate of the inter-wiring capacitance at the inter-wiring electrical capacitance life was 10% or more. That is, in the case of manufacturing the multi-layered copper wirings in the semiconductor device using the organic siloxane film shown in Comparative Examples 1 to 3 as the inter-layer insulating film, it was shown that the inter-wiring capacitance increased as high as by 10% or more.

DESCRIPTION OF REFERENCES

Figure 1:
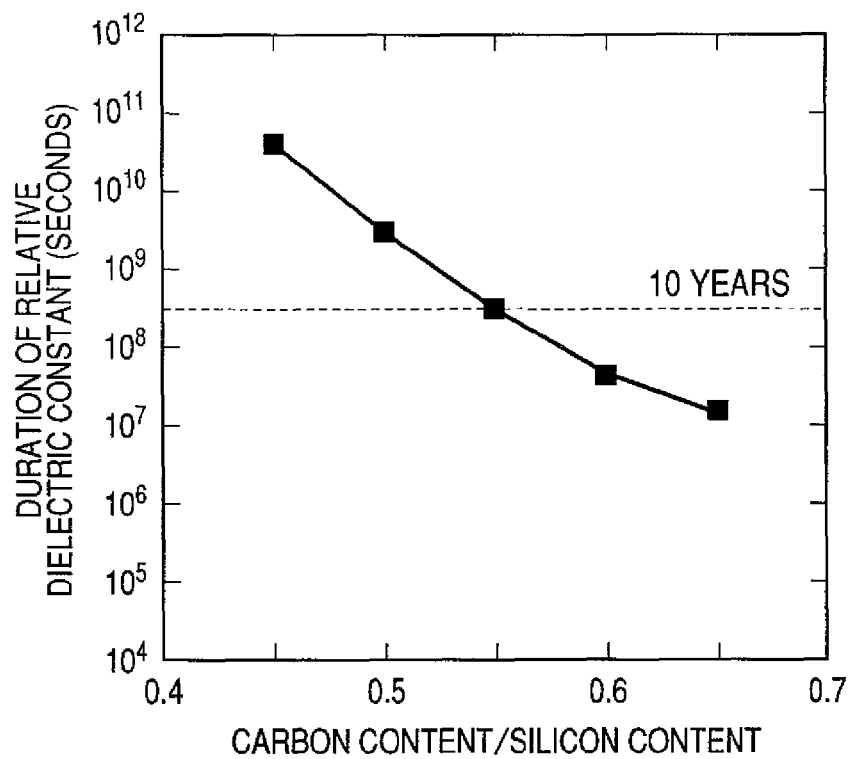
FIG. 1 is a graph showing a relation between a carbon content/silicon content in an organic siloxane film and a relative dielectric constant life at an electric field strength used actually.
Figure 2:
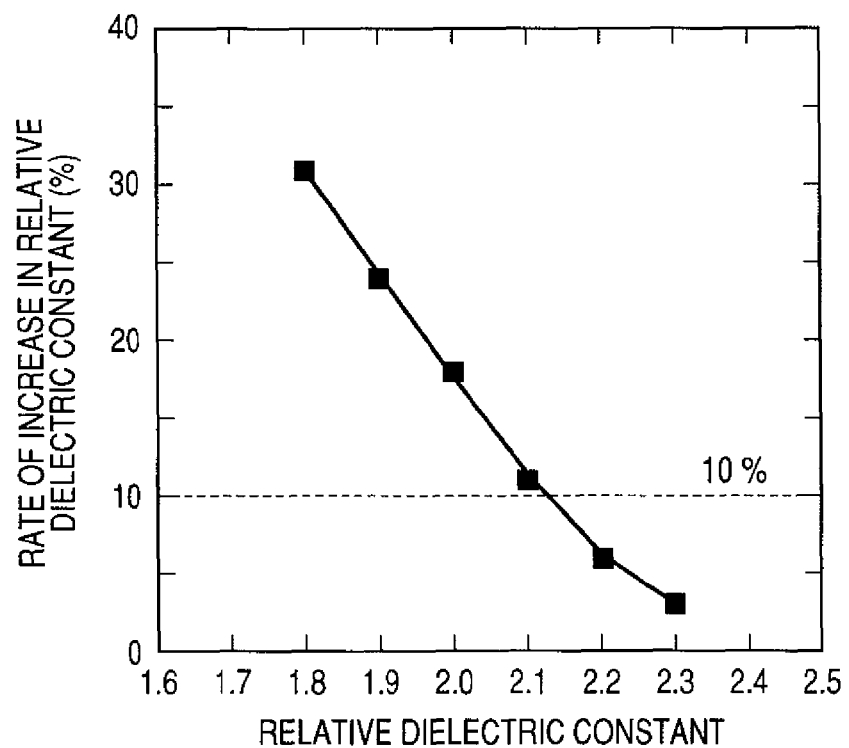
FIG. 2 is a graph showing a relation between a relative dielectric constant in an organic siloxane film and increasing rate of a relative dielectric constant at an electric field strength used actually.
Figure 3:
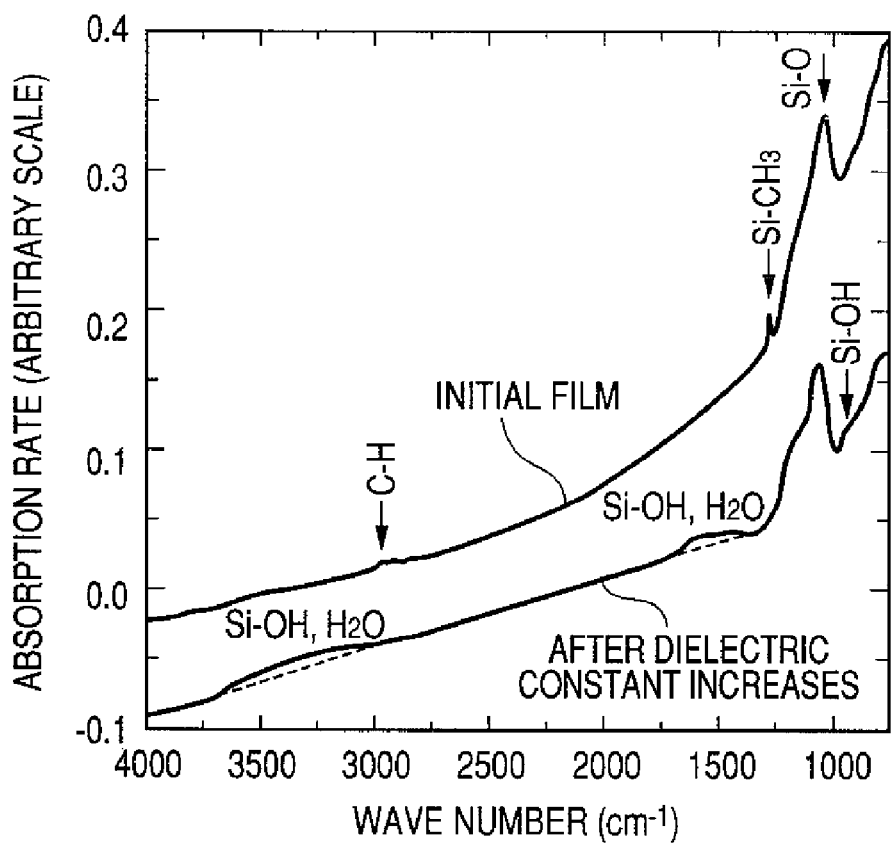
FIG. 3 is a graph showing comparison for spectra of Fourier conversion type IR spectroscopy between the initial film of an organic siloxane film and that after the increase of the relative dielectric constant.
Figure 4:
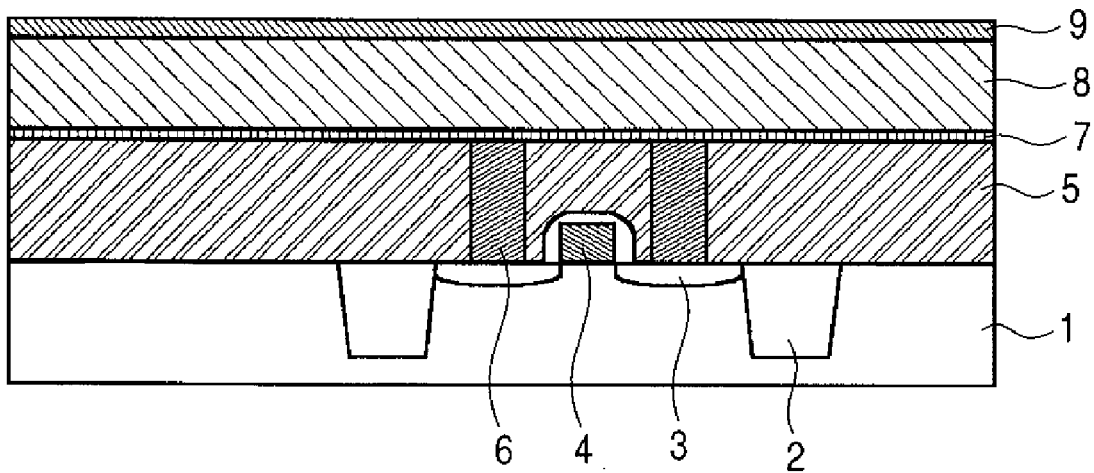
FIG. 4 is a cross sectional view of a main portion (1) for explaining a process of forming wirings in Example 5 of the invention.
Figure 5:
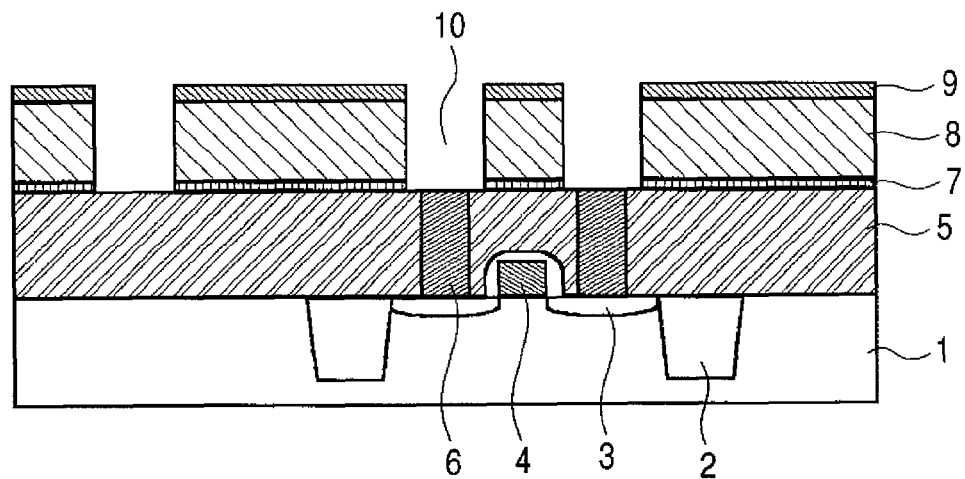
FIG. 5 is a cross sectional view of a main portion (2) for explaining a process of forming wirings in Example 5 of the invention.
Figure 6:
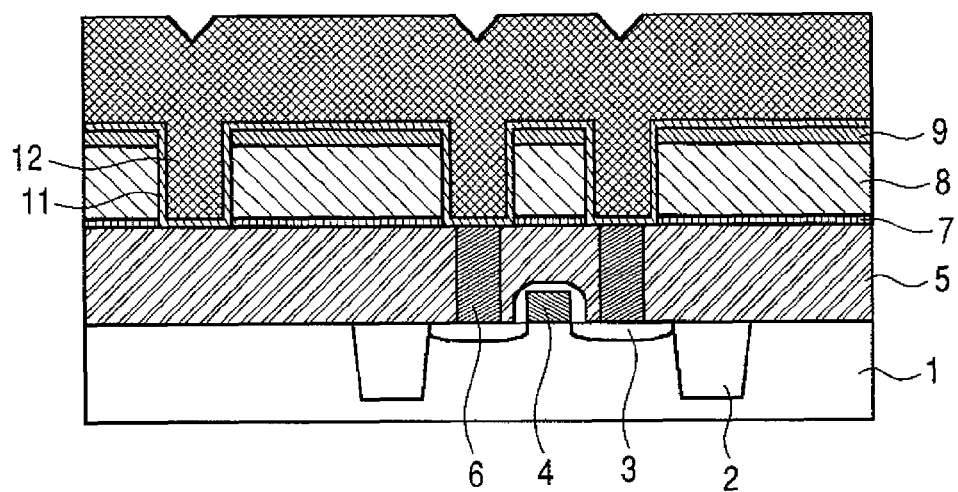
FIG. 6 is a cross sectional view of a main portion (3) for explaining a process of forming wirings in Example 5 of the invention.
Figure 7:
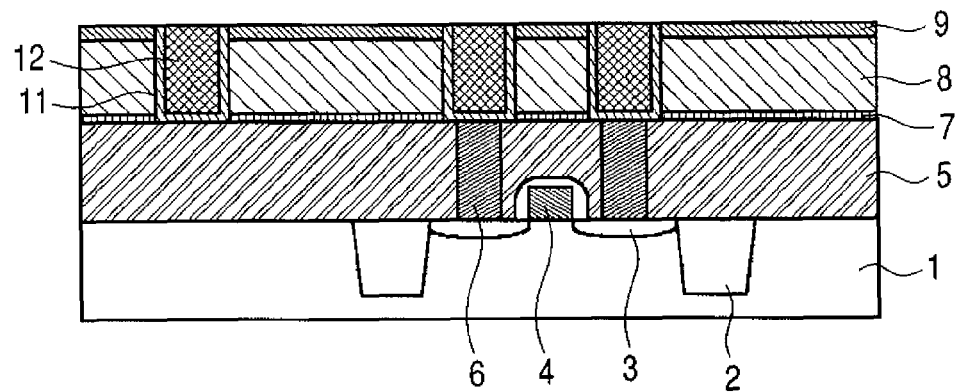
FIG. 7 is a cross sectional view of a main portion (4) for explaining a process of forming wirings in Example 5 of the invention.
Figure 8:
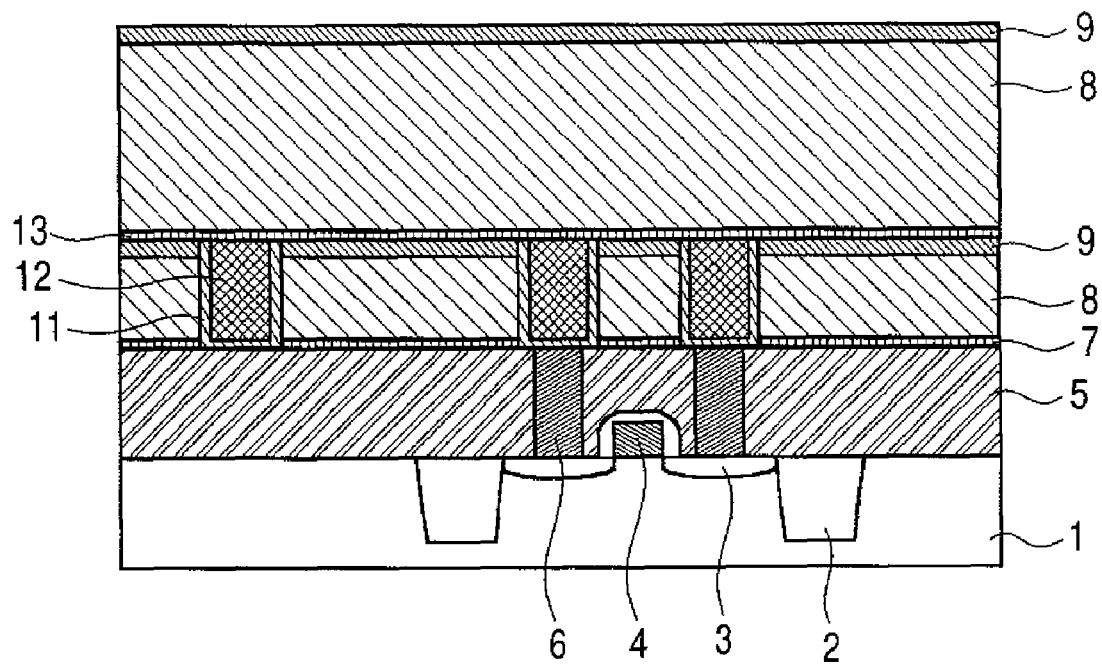
FIG. 8 is a cross sectional view of a main portion (5) for explaining a step of forming wirings in Example 5 of the invention.
Figure 9:
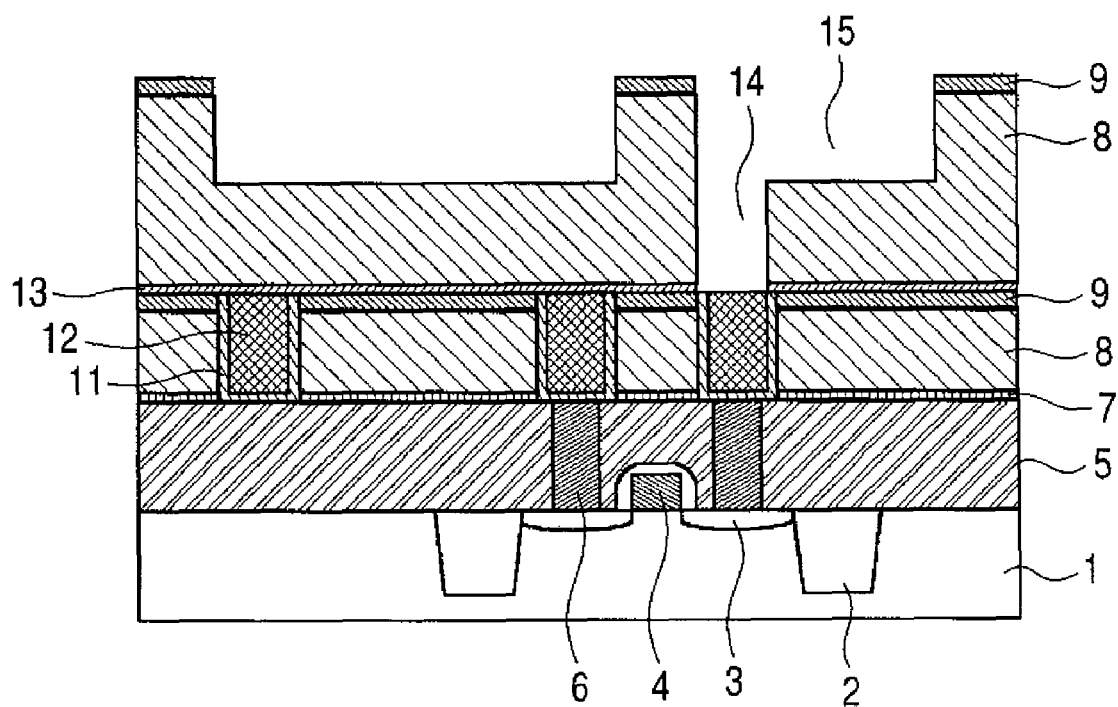
FIG. 9 is a cross sectional view of a main portion (6) for explaining a process of forming wirings in Example 5 of the invention.
Figure 10:
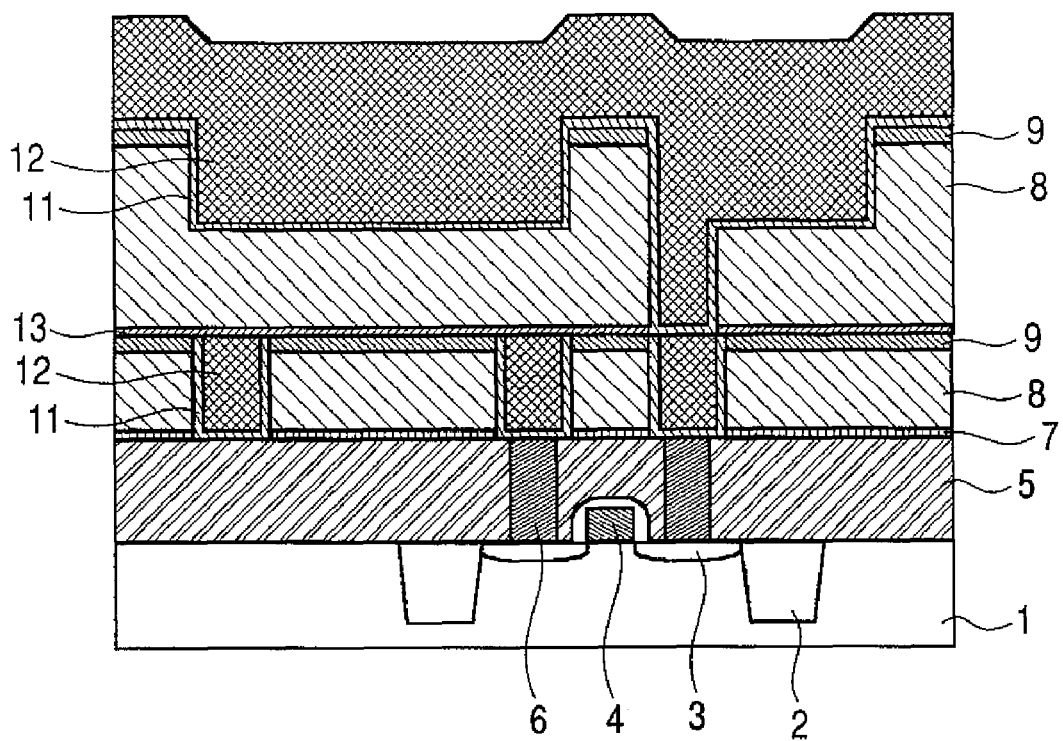
FIG. 10 is a cross sectional view of a main portion (7) for explaining a process of forming wirings in Example 5 of the invention.
Figure 11:
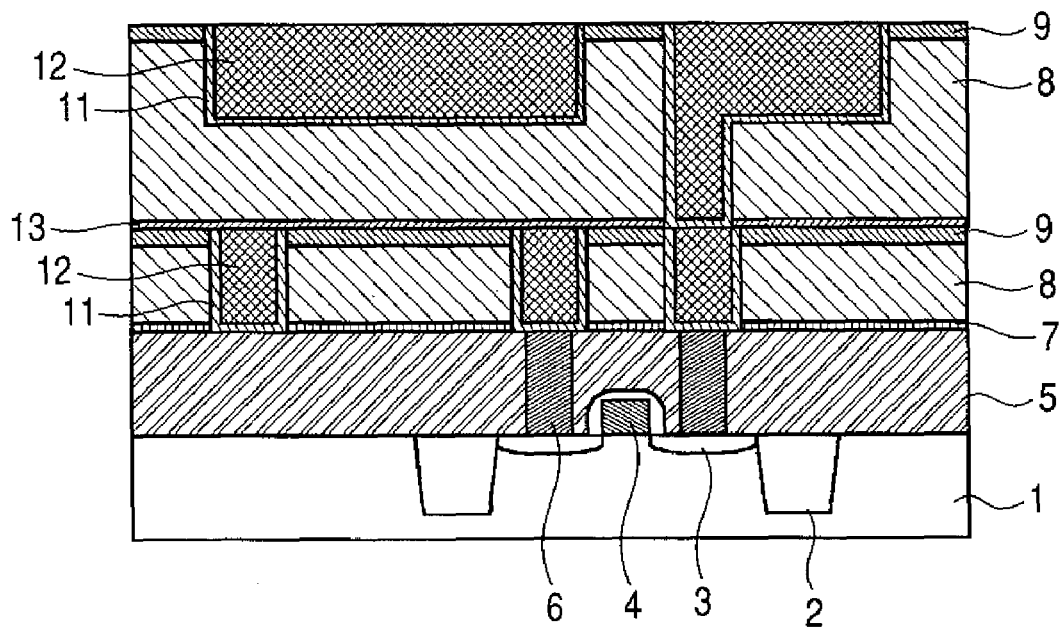
FIG. 11 is a cross sectional view of a main portion (8) for explaining a process of forming wirings in Example of the invention.
Figure 12:
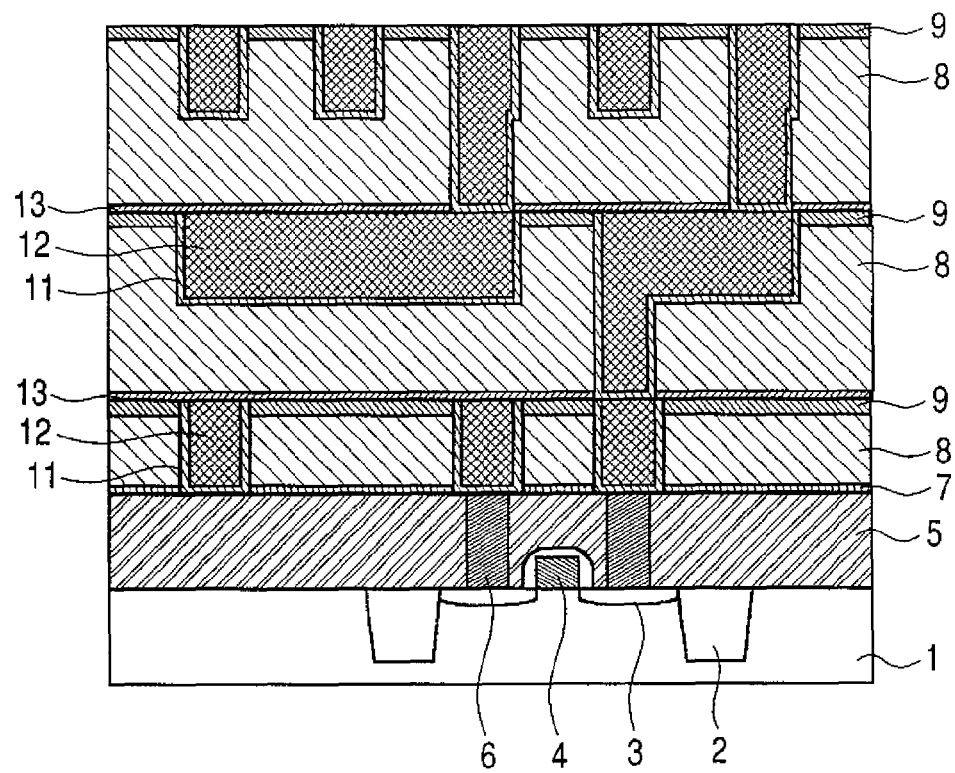
FIG. 12 is a cross sectional view of a main portion (9) for explaining a process of forming wirings in Example 5 of the invention.
Figure 13:
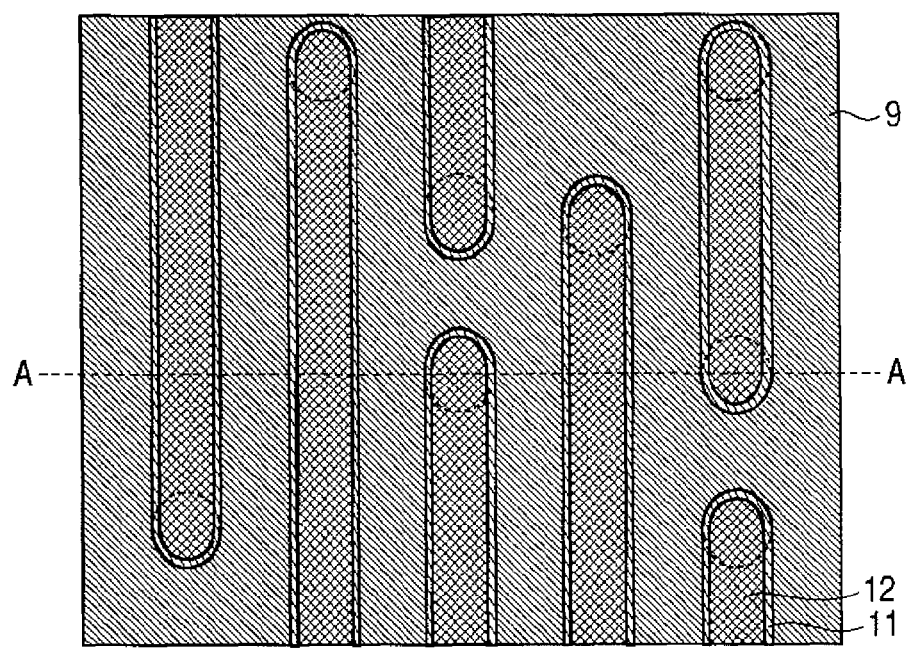
FIG. 13 is an upper plan view of a main portion for explaining a process of forming wirings in Example 5 of the invention.
Figure 14:
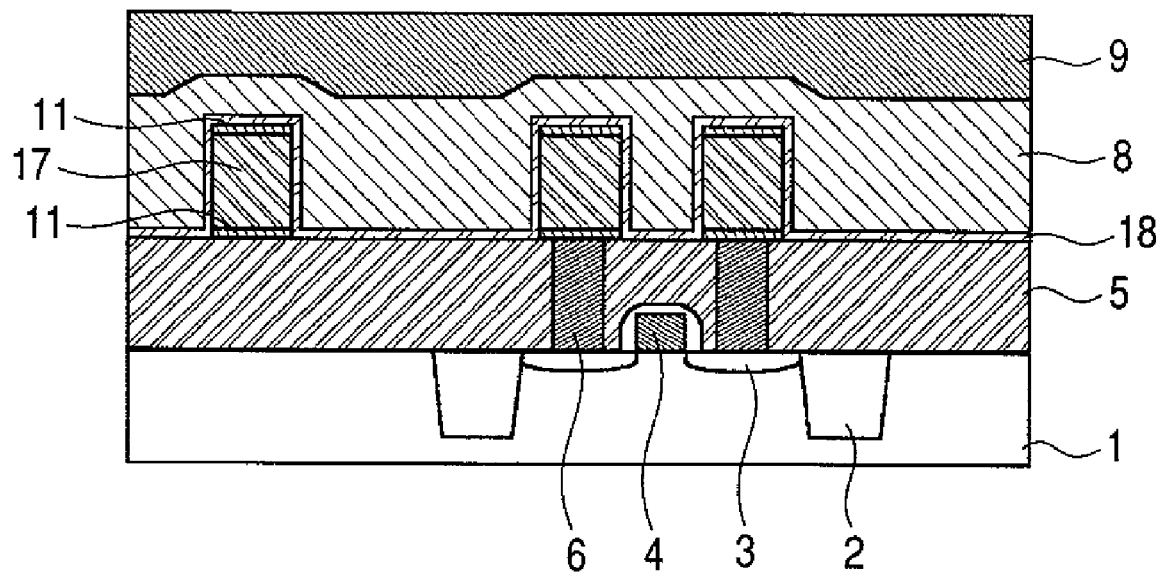
FIG. 14 is a cross sectional view of a main portion (1) for explaining a process of forming wirings in Example of the invention.
Figure 15:
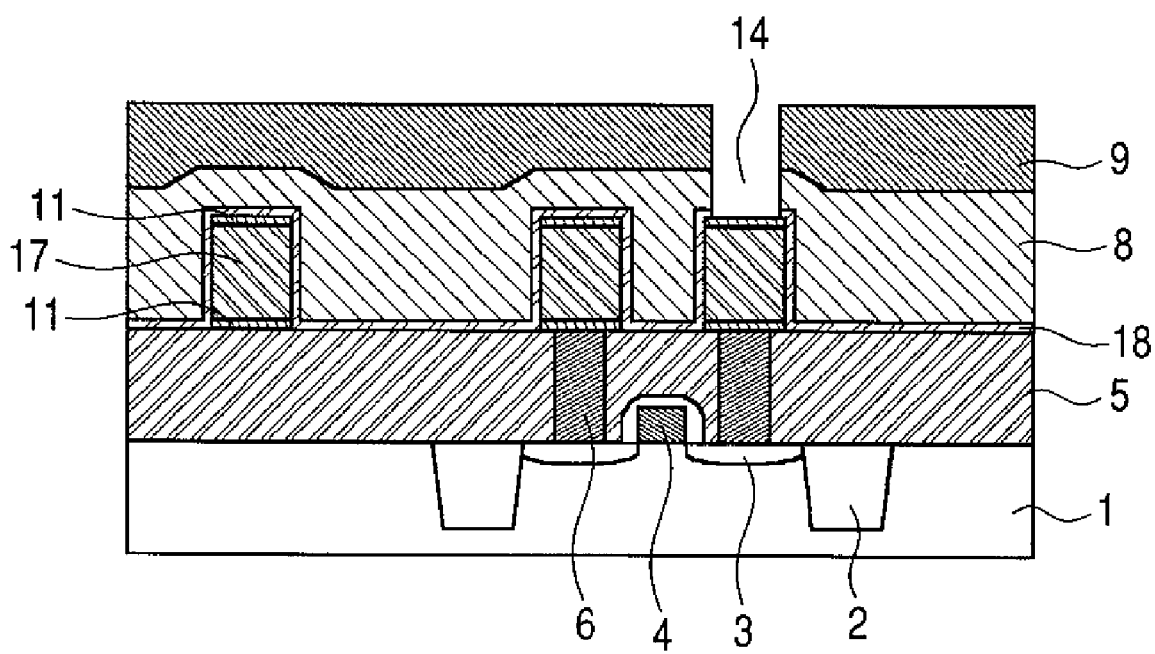
FIG. 15 is a cross sectional view of a main portion (2) for explaining a process of forming wirings in Example of the invention.
Figure 16:
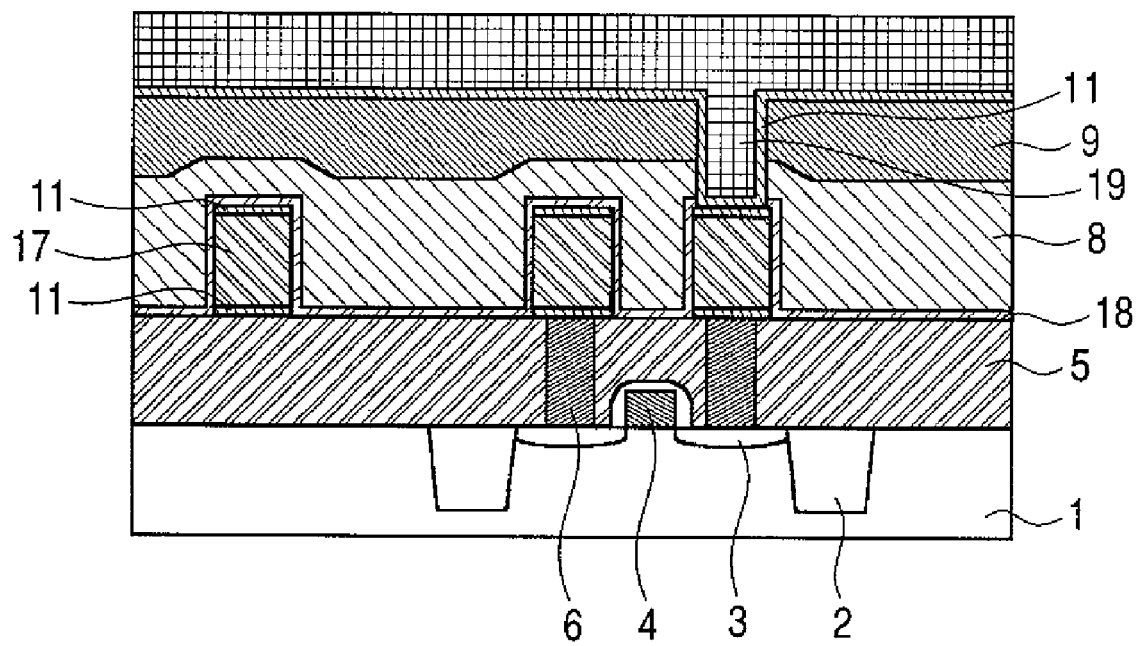
FIG. 16 is a cross sectional view of a main portion (3) for explaining a process of forming wirings in Example of the invention.
Figure 17:
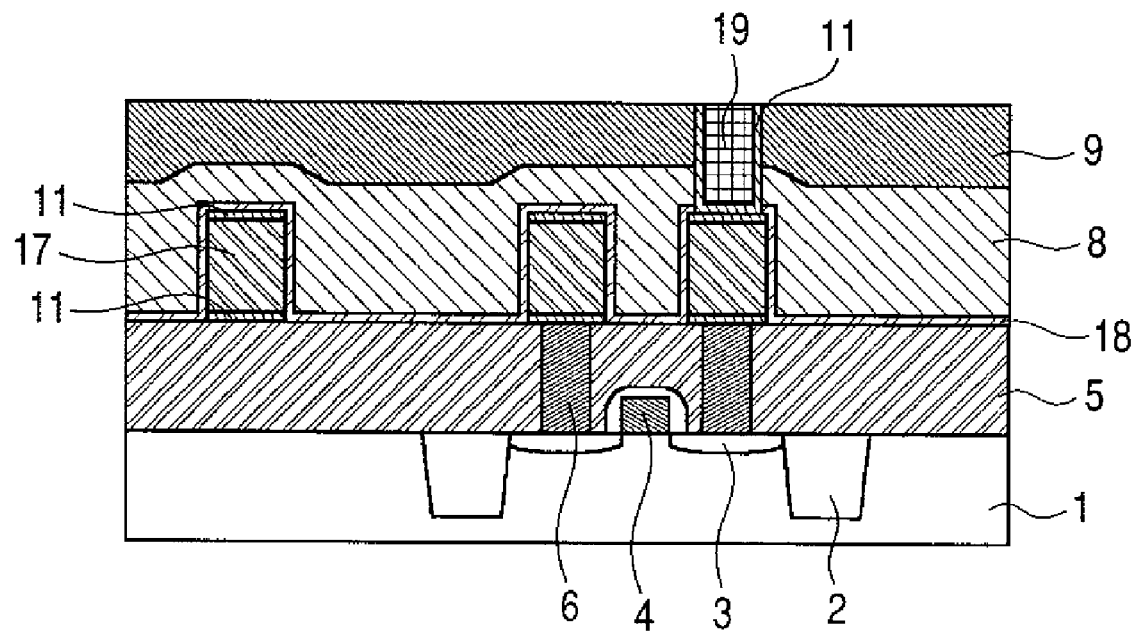
FIG. 17 is a cross sectional view of a main portion (4) for explaining a process of forming wirings in Example 6 of the invention.
Figure 18:
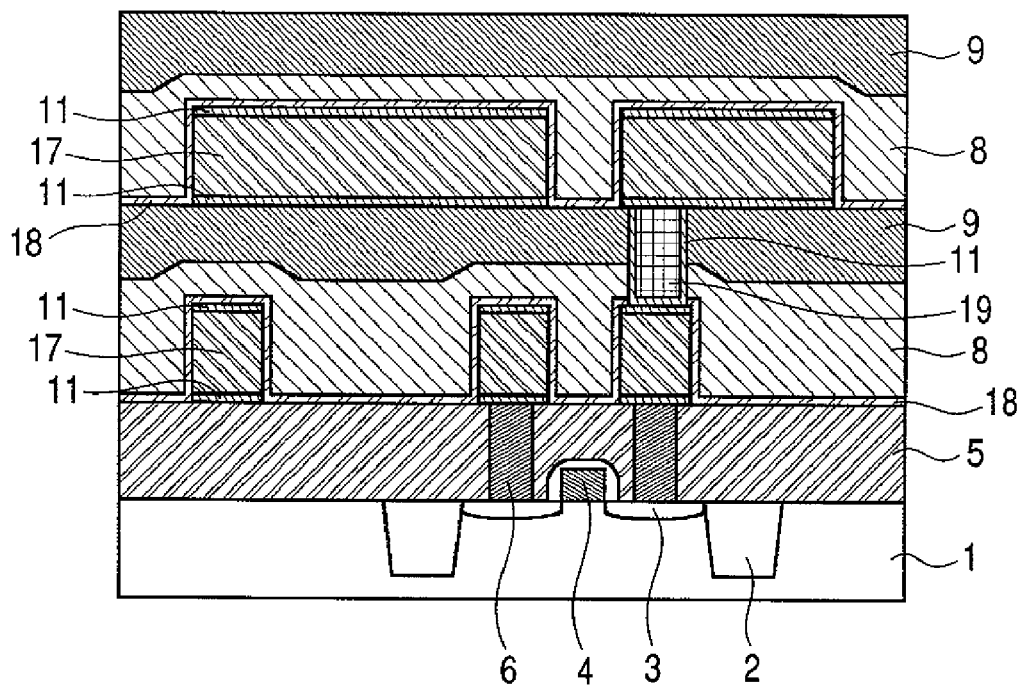
FIG. 18 is a cross sectional view of a main portion (5) for explaining a process of forming wirings in Example 6 of the invention.
Figure 19:
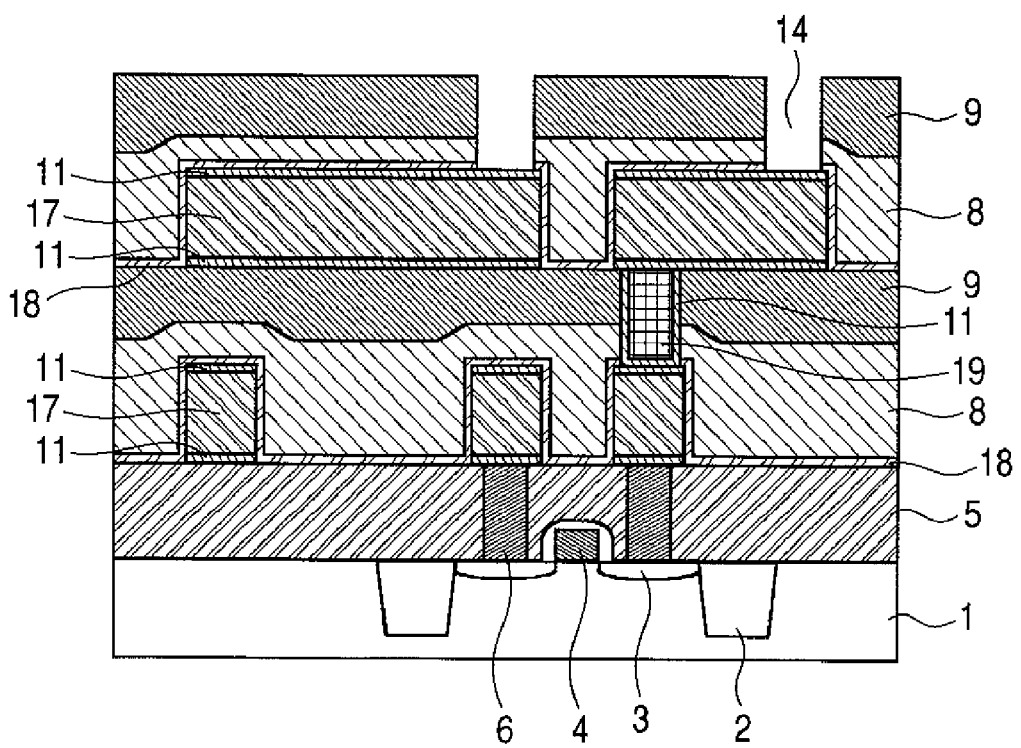
FIG. 19 is a cross sectional view of a main portion (6) for explaining a process of forming wirings in Example 6 of the invention.
Figure 20:
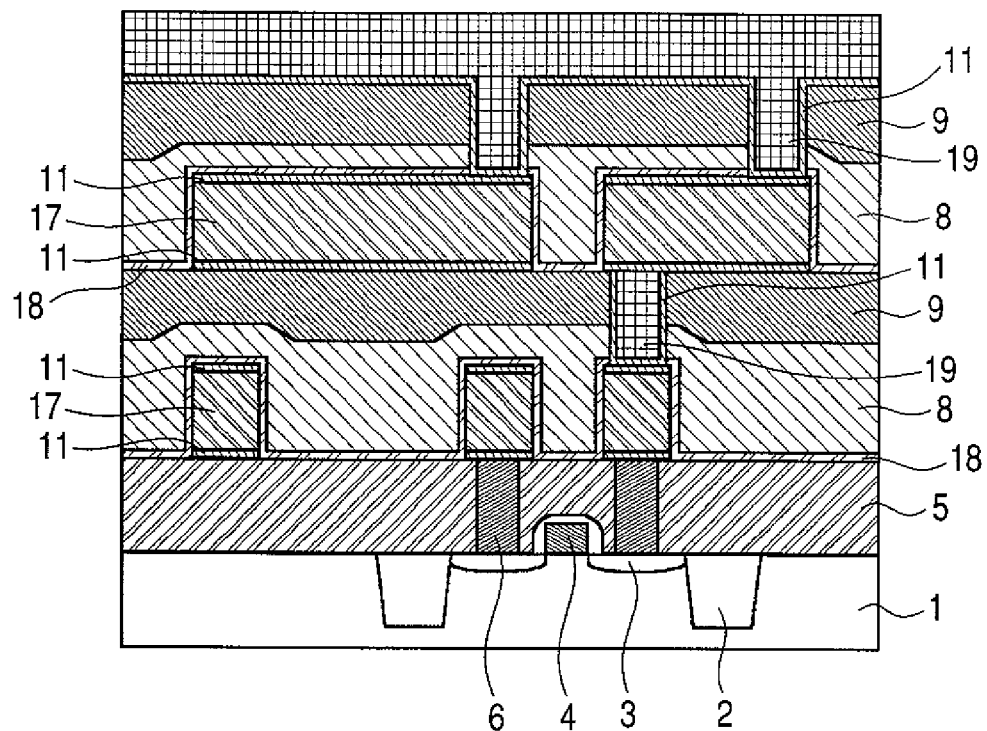
FIG. 20 is a cross sectional view of a main portion (7) for explaining a process of forming wirings in Example 6 of the invention.
Figure 21:
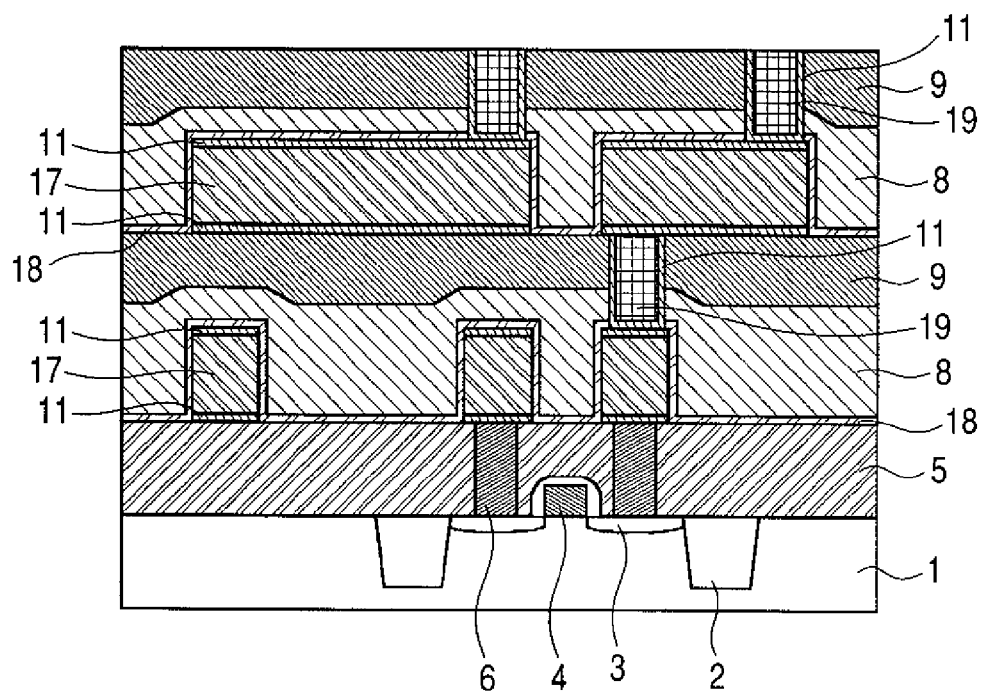
FIG. 21 is a cross sectional view of a main portion (8) for explaining a process of forming wirings in Example 6 of the invention.
Figure 22:
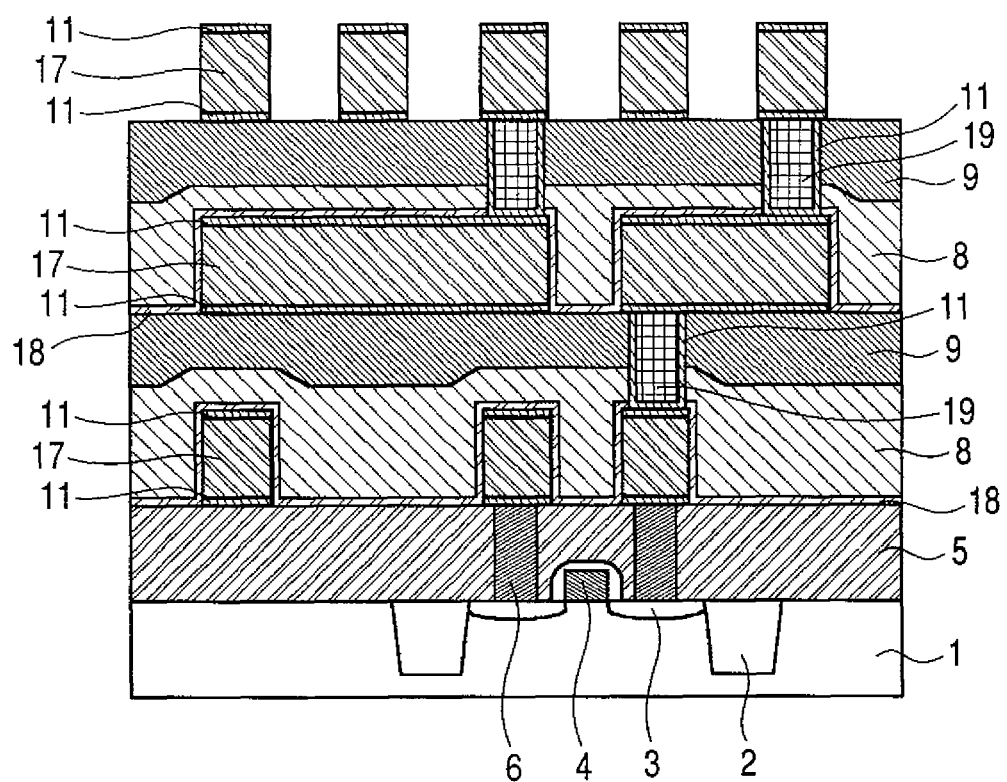
FIG. 22 is a cross sectional view of a main portion (9) for explaining a process of forming wirings in Example 6 of the invention.
Figure 23:
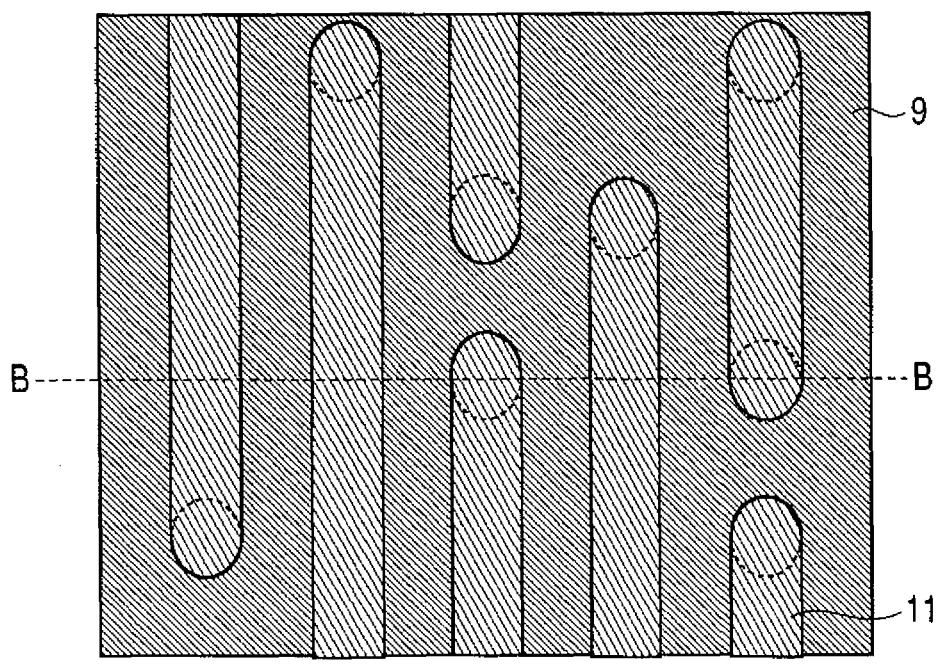
FIG. 23 is an upper plan view of a main portion for explaining a process of forming wirings in Example 6 of the invention.

1 . . . silicon substrate
2 . . . device isolation structure
3 . . . impurity diffusion layer
4 . . . gate electrode
5 . . . first inter-layer insulating film
6 . . . contact plug
7 . . . second inter-layer insulating film
8 . . . organic siloxane film
9 . . . protection insulating film
10 . . . first layer wiring trench
11 . . . barrier metal
12 . . . copper film
13 . . . barrier insulating film
14 . . . inter-layer connection hole
15 . . . second layer wiring trench
17 . . . aluminum alloy
18 . . . third inter-layer insulating film
19 . . . tungsten film

The invention claimed is:

1. An organic siloxane film with a relative dielectric constant of 2.1 or less and containing at least silicon, oxygen, carbon, and hydrogen, in which
the element ratio of the carbon content to the silicon content in the organic siloxane film is 0.10 or more and 0.55 or less.

2. An organic siloxane film according to claim 1, characterized in that the relative dielectric constant is 1.5 or more and 2.1 or less.

3. An organic siloxane film according to claim 1, characterized in that the relative dielectric constant is 1.8 or more and 2.1 or less.

4. An organic siloxane film according to claim 1, characterized in that
the element ratio of the carbon content to the silicon content in the organic siloxane film is 0.25 or more and 0.55 or less.

5. An organic siloxane film according to claim 1, characterized in that
the element ratio of the carbon content to the silicon content in the organic siloxane film is 0.40 or more and 0.55 or less.

6. An organic siloxane film according to claim 1, characterized in that
a main organic group of the organic siloxane film is a methyl group.

7. An organic siloxane film according to claim 1, characterized in that
a process of forming the organic siloxane film includes at least a step of coating a raw material liquid containing a polysiloxane on a substrate.

8. An organic siloxane film according to claim 6, characterized in that
a process of forming the organic siloxane film includes at least a step of coating a raw material liquid containing a polysiloxane on a substrate.

9. An organic siloxane film according to claim 1, characterized in that
a process of forming the film includes at least a step of depositing a film on a substrate by plasma chemical vapor deposition or thermal chemical vapor deposition.

10. An organic siloxane film according to claim 6, characterized in that
a process of forming the film includes at least a step of depositing a film on a substrate by plasma chemical vapor deposition or thermal chemical vapor deposition.

11. A semiconductor device characterized by including an organic siloxane film according to claim 1 as an inter-layer insulative material.

12. A semiconductor device characterized by including an organic siloxane film according to claim 6 as an inter-layer insulative material.

13. A semiconductor device according to claim 11, characterized by using an organic siloxane film as an inter-layer insulating film of a multi-layered wiring structure in the multi-layered wiring structure using copper as the wiring material.

14. A semiconductor device according to claim 12, characterized by using an organic siloxane film as an inter-layer insulating film of a multi-layered wiring structure in the multi-layered wiring structure using copper as the wiring material.

15. A semiconductor device according to claim 11, characterized by using an organic siloxane film as an inter-layer insulating film of a multi-layered wiring structure in the multi-layered wiring structure using an aluminum alloy as the wiring material.

16. A semiconductor device according to claim 12, characterized by using an organic siloxane film as an inter-layer insulating film of a multi-layered wiring structure in the multi-layered wiring structure using an aluminum alloy as the wiring material.

17. A flat plate display device characterized by including an organic siloxane film according to claim 1.

18. A flat plate display device characterized by including an organic siloxane film according to claim 6.

19. A flat plate display device characterized by containing an organic siloxane film according to claim 1 as an inter-layer insulative material.

20. A flat plate display device characterized by containing an organic siloxane film according to claim 6 as an inter-layer insulative material.

* * * * *